United States Patent
Kambara

(10) Patent No.: US 8,006,143 B2
(45) Date of Patent: Aug. 23, 2011

(54) SEMICONDUCTOR MEMORY DEVICE AND SEMICONDUCTOR MEMORY DEVICE TEST METHOD

(75) Inventor: Fumi Kambara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 139 days.

(21) Appl. No.: 12/393,145

(22) Filed: Feb. 26, 2009

(65) Prior Publication Data
US 2009/0196108 A1 Aug. 6, 2009

Related U.S. Application Data

(63) Continuation of application No. PCT/JP2006/317421, filed on Sep. 4, 2006.

(51) Int. Cl.
*G11C 29/00* (2006.01)
(52) U.S. Cl. .................. 714/710; 714/727
(58) Field of Classification Search ............ 365/200, 365/201, 230.03, 210; 324/550; 714/718, 714/733, 710, 727
See application file for complete search history.

(56) References Cited

U.S. PATENT DOCUMENTS

| | | | |
|---|---|---|---|
| 6,301,164 B1 * | 10/2001 | Manning et al. | 365/200 |
| 6,320,800 B1 * | 11/2001 | Saito et al. | 365/189.19 |
| 6,420,896 B1 | 7/2002 | Maeno | 326/9 |
| 6,496,429 B2 | 12/2002 | Murai | 365/200 |
| 6,532,181 B2 * | 3/2003 | Saito et al. | 365/200 |
| 6,894,943 B2 * | 5/2005 | Suzuki et al. | 365/230.03 |
| 7,071,704 B1 * | 7/2006 | Crowell | 324/550 |
| 2003/0117872 A1 * | 6/2003 | Akamatsu | 365/201 |

FOREIGN PATENT DOCUMENTS

| | | |
|---|---|---|
| JP | 6-103794 | 4/1994 |
| JP | 8-161897 | 6/1996 |
| JP | 2002-42484 | 2/2002 |
| JP | 2002-269993 | 9/2002 |

OTHER PUBLICATIONS

International Preliminary Report on Patentability, mailed Mar. 17, 2009, in corresponding International Application No. PCT/JP2006/317421 (5 pp.).

* cited by examiner

*Primary Examiner* — David Ton
(74) *Attorney, Agent, or Firm* — Staas & Halsey LLP

(57) ABSTRACT

A semiconductor memory device having a first memory block used when it is determined to be used in a first case, a second memory block used as an alternative of the first memory blocks when it is determined to be used in a second case, a write section that writes determination data into the first memory block for making a determination at the time of the determination and writes the determination data into the second memory block and a read section that reads the determination data written into the first memory block by the write section for making a determination at the time of the determination and reads the determination data written into the second memory block by the write section.

13 Claims, 9 Drawing Sheets

SEMICONDUCTOR MEMORY DEVICE AND SEMICONDUCTOR MEMORY DEVICE TEST METHOD

This application is a continuing application, filed under 35 U.S.C. §111(a), of International Application PCT/JP2006/317421, filed Sep. 4, 2006, the disclosure of which is herein incorporated in its entirety by reference. The present invention relates to a semiconductor memory device having redundant cells that can be used as substitutes for ordinary memory cells and a semiconductor memory device test method.

BACKGROUND

With an increase in the memory capacity of an RAM (Random Access Memory), memory cell defect becomes a big problem. In a configuration in which all memory cells in an RAM are used, if any one of memory cells were to malfunction, the entire RAM becomes disabled. In order to cope with this, a configuration is adopted in which redundant cells, which are memory cells previously prepared as substitute for ordinarily used memory cells are provided in case any of the ordinary cells are defective memory cells. In this configuration, when a defective cell is found among the ordinary cells by a PT (Probe Test), a redundant cell is used in place of the defective cell. Such a technique has now widely been used so as to increase yield. The PT test is a test that is carried out by pressing a probe onto an electrode pad provided on each chip on the wafer. When an ordinary cell is replaced with a redundant cell, a fuse for supplying a cell selection signal is cut off.

A configuration of a conventional semiconductor memory device will be described below by separating it into a write structure and a read structure.

FIG. 8 is a block diagram showing an example of a write structure of a conventional semiconductor memory device. This semiconductor memory device includes a fuse decoder circuit 111, a memory block selection unit (MEM. BLOCK selection unit) 211, a column selection circuit (Col. Select) 311, memory blocks (MEM. BLOCK) M39, M38, ..., M1, M0, MR, and latches WD39, WD38, ..., WD1, WD0 for retaining write data. Each of the memory blocks has at least one memory cell. The 40 memory blocks M39, M38, ..., M1, M0 are ordinary memory blocks, and one memory block MR is a redundant memory block (redundant MEM. BLOCK).

The memory block selection unit 211 includes 41 selectors. The selectors select an input according to corresponding control signals SR, S39, S38, ..., S1, S0 output from the fuse decoder circuit 111 and outputs the selected input to corresponding memory blocks M39, M38, ..., M1, M0, MR.

A selector corresponding to control signal SR selects VSS (indicating that a corresponding memory block is not used) or data of latch WD39 and writes the selected one into memory block M39. A selector corresponding to control signal S39 selects data of latch WD39 or data of latch WD38 and writes the selected one into memory block M38. Similarly, a selector corresponding to control signal S(i) (i is an integer number from 1 to 38) selects data of adjacent two latches, i.e., data of latch WD(i) or data of latch WD(i−1) and writes the selected one into memory block M(i−1) connected to the output thereof. A selector corresponding to control signal S0 selects data of latch WD0 or VSS (indicating that a corresponding memory block is not used) and writes the selected one into memory block M0.

The column selection circuit 311 selects a column corresponding to one of the memory blocks M39, M38, ..., M1, M0, MR according to an instruction from an external device. Although not shown, the semiconductor memory device further includes a row selection circuit for selecting a row (memory cell) in each of the memory blocks M39, M38, ..., M1, M0, MR according to an instruction from an external device.

FIG. 9 is a block diagram showing an example of a read structure of the conventional semiconductor memory device. In FIG. 9, the same reference numerals as those in FIG. 8 denote the same or corresponding parts as those in FIG. 8, and the descriptions thereof will be omitted here. As compared to the write structure shown in FIG. 8, the semiconductor memory device of FIG. 9 includes a memory block selection unit 212 in place of the memory block selection unit 211, a column selection circuit 312 in place of the column selection circuit 311, and latches RD39, RD38, ..., RD1, RD0 for retaining read data in place of the latches WD39, WD38, ..., WD1, WD0. The latches RD39, RD38, ..., RD1, RD0 are connected to a scan chain in the order mentioned.

The memory block selection unit 212 includes 40 selectors. The selectors select an input according to corresponding control signals S39, S38, ..., S1, S0 output from the fuse decoder circuit 111 and outputs the selected input to corresponding latches RD39, RD38, ..., RD1, RD0.

A selector corresponding to control signal S39 selects data of memory block M39 and data of memory block M38 and writes the selected one into latch RD39. Similarly, a selector corresponding to control signal S(i) (i is an integer number from 0 to 38) selects data of adjacent two memory blocks, i.e., data of memory block M(i) or data of memory block M(i−1) and writes the selected one into latch RD(i) connected to the output thereof.

The column selection circuit 312 selects a column corresponding to one of the memory blocks M39, M38, ..., M1, M0, MR. Although not shown, the semiconductor memory device further includes a row selection circuit for selecting a row in each of the memory blocks M39, M38, ..., M1, M0, MR.

The fuse decoder circuit 111 decodes a FUSE signal from a not shown fuse circuit or an external device to generate the control signals SR, S39, S38, ..., S1, S0, inputs the control signals SR, S39, S38, ..., S1, S0 to respective selectors in the memory block selection unit 211 inputs the control signals S39, S38, ..., S1, S0 to respective selectors 212 in the memory block selection unit.

In this semiconductor memory device, each of the memory blocks (ordinary memory blocks M0 to M39 constituted by ordinary cells and redundant memory block MR constituted by redundant cells) is constituted by a plurality of memory cells, and data is written into 1-bit memory cell selected by the column selection circuit 311 and row selection circuit and data is read out from 1-bit memory cell selected by the column selection circuit 312 and row selection circuit. Further, this semiconductor memory device has 1-bit redundant cell per 40-bit ordinary cell.

Operation of the semiconductor memory device at normal operation time where there is no defective cell in the ordinary memory block will be described.

At data write time, data of, e.g., latch WD39 is written into memory block M39. That is, data of latches WD39, WD38, ..., WD1, WD0 are written into memory blocks M39, M38, ..., M1, M0 along the paths of the memory block selection unit 211.

At data read time, data that has been written into memory block M39 is read out by latch RD39. That is, data of memory blocks M39, M38, ..., M1, M0 are read by latches RD39, RD38, ..., RD1, RD0 according to the operation of the memory block selection unit 212.

Operation of the semiconductor memory device at normal operation time where there is any defective cell in the ordinary memory block will be described.

Assuming that a defective cell exists in memory block M39 marked with diagonal lines in FIGS. 8 and 9, a FUSE signal specifying memory block M39 including the defective cell is input to the fuse decoder circuit 111, decoded, and then input to the memory block selection unit 211. Data of latch WD39 is written into memory block M38 through the memory block selection unit 211. That is, data of latches WD39, WD38, ..., WD1, WD0 are written into memory blocks M38, M37, ..., M1, M0, MR according to the operation of the memory block selection unit 211.

Similarly, a FUSE signal specifying memory block M39 including the defective cell is input to the fuse decoder circuit 111, decoded, and then input to the memory block selection unit 212. Data of memory block M38 is read out by latch RD39 through the memory block selection unit 212. That is, data of memory blocks M38, M37, ..., M1, M0, MR are read out by latches RD39, RD38, ..., RD1, RD0 according to the paths of the memory block selection unit 212.

The FUSE signal is generated by a not shown fuse circuit and is input to the fuse decoder circuit 111. In the case where a defective cell exists, a fuse in the fuse circuit that corresponds to the defective cell is cut off and, correspondingly, the fuse circuit generates the FUSE signal indicating the defective cell. The Fuse signal may be input from outside of the semiconductor memory device.

However, if a defect is found in the redundant cell which is supposed to relieve a defective cell, the defective cell cannot be relieved even if the fuse is cut off, resulting in a waste of man-hours. In order to avoid this, an operation test of the redundant cells is conducted before the cutting off of the fuse. In the case where an operation test of redundant cells is conducted before the cutting off of the fuse, two test methods are available.

In the first test method, an operation test of ordinary cells in which read/write operation is performed for ordinary cells is carried out in a state where there issued no indication of a defective cell by means of the FUSE signal to thereby detect a defective cell, and then a FUSE signal is given from outside so that the defective cell is switched to a redundant cell, followed by a redundant cell test in which read/write operation is performed for the redundant cells. In the second test method, an ordinary cell test is carried out first and then, irrespective of presence/absence of a defective cell, an access is forcibly made to redundant cells by means of the FUSE signal from outside to carry out a redundant cell test.

In the ordinary cell test and redundant cell test, data of latches RD39, RD38, ..., RD1, RD0 are read out through the scan chain and then compared to data of latches WD39, WD38, ..., WD1, WD0 that have been used for write operation, whereby it is determined whether respective cells are normal or not.

Japanese Laid-Open Patent Publication No. 08-161897 discloses a semiconductor memory device having error correction function capable of writing desired data into both data bit and redundant bit for test purpose.

SUMMARY

According to an aspect of the invention, a semiconductor memory device having a first memory block used when it is determined to be used in a first case, a second memory block used as an alternative of the first memory blocks when it is determined to be used in a second case, a write section that writes determination data into the first memory block for making a determination at the time of the determination and writes the determination data into the second memory block and a read section that reads the determination data written into the first memory block by the write section for making a determination at the time of the determination and reads the determination data written into the second memory block by the write section.

DESCRIPTION OF EMBODIMENTS

Embodiments of the present invention will be described below with reference to the accompanying drawings.

First Embodiment

A configuration of a semiconductor memory device according to the present embodiment will be described below by separating it into a write structure and a read structure.

Figure 1:
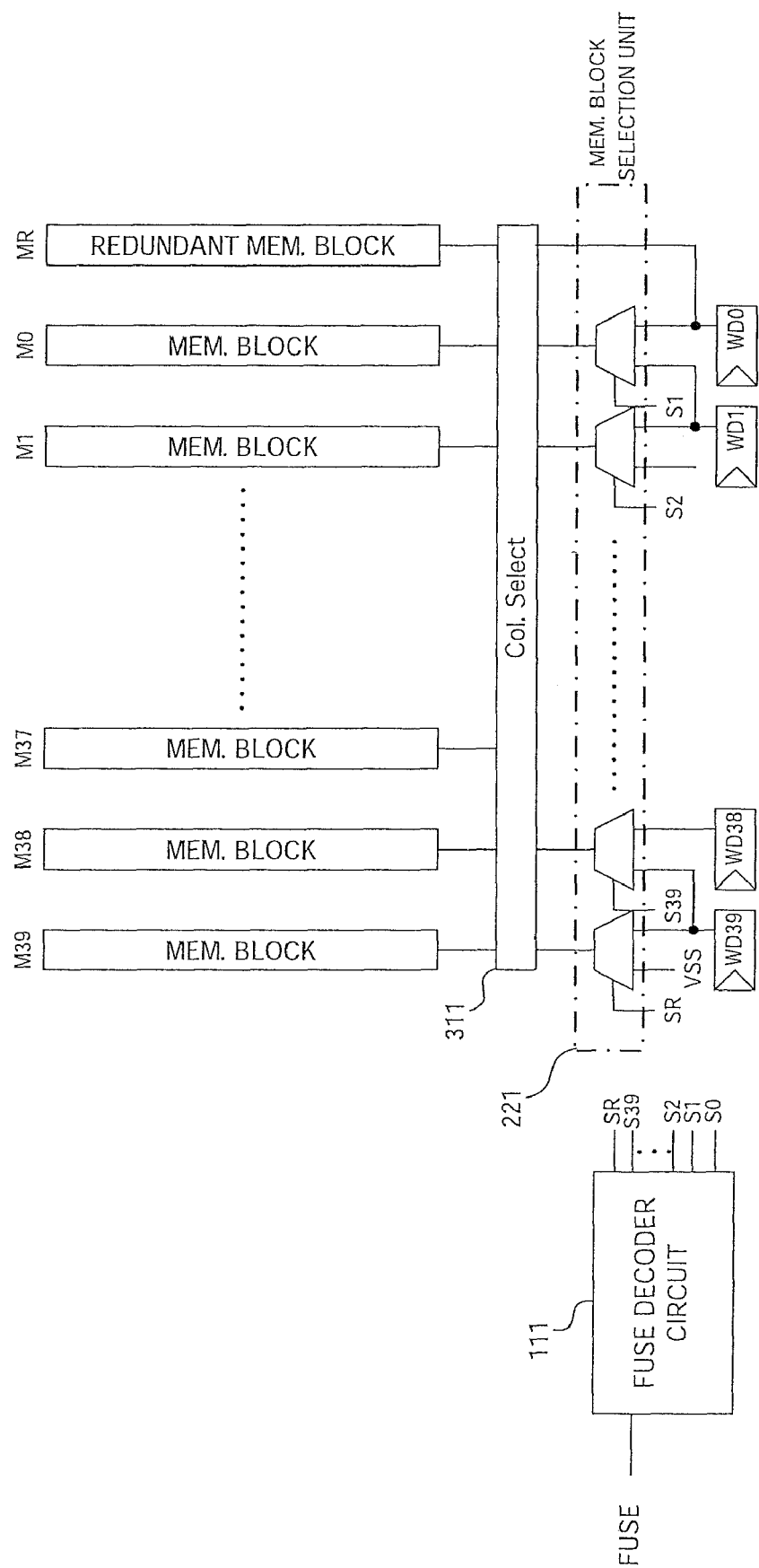
FIG. 1 is a block diagram showing an example of a write structure of a semiconductor memory device according to a first embodiment of the present invention.

FIG. 1 is a block diagram showing an example of a write structure of a semiconductor memory device according to the present invention. In FIG. 1, the same reference numerals as those in FIG. 8 denote the same or corresponding parts as those in FIG. 8, and the descriptions thereof will be omitted here. As compared to the write structure shown in FIG. 8, the semiconductor memory device of FIG. 1 includes a memory block selection unit 221 in place of the memory block selection unit 211. The memory block selection unit 221 has 40 selectors and does not require a selector corresponding to control signal S0 in the memory block selection unit 211. That is, memory block MR and latch WD0 are directly connected to each other.

Figure 2:
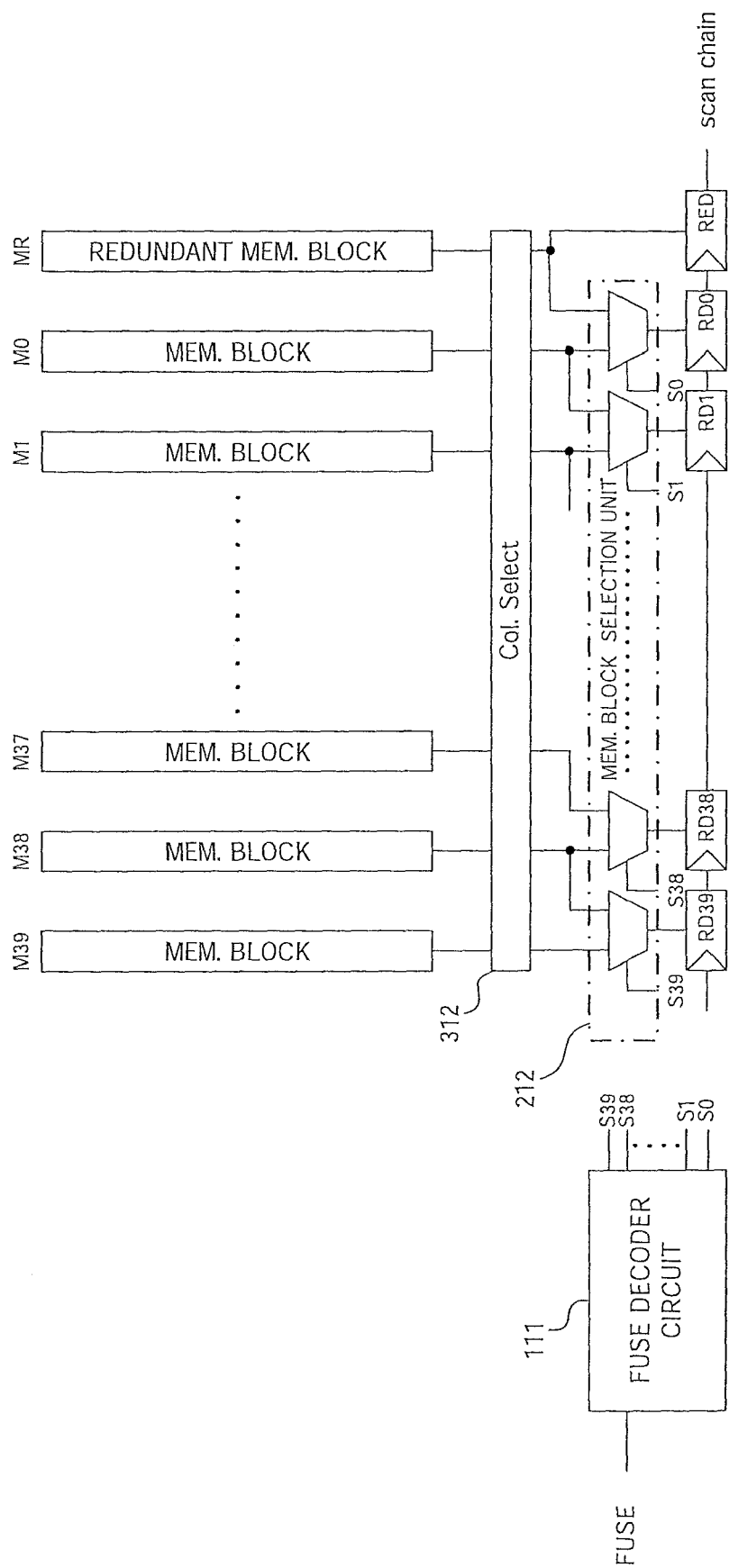
FIG. 2 is a block diagram showing an example of a read structure of the semiconductor memory device according to the first embodiment.

FIG. 2 is a block diagram showing an example of a read structure of the semiconductor memory device according to the present embodiment. In FIG. 2, the same reference numerals as those in FIG. 9 denote the same or corresponding parts as those in FIG. 9, and the descriptions thereof will be omitted here. As compared to the read structure shown in FIG. 9, the semiconductor memory device of FIG. 1 newly includes a latch RED. The latch RED latches data read out from memory block MR. Further, the latch RED is connected to a scan chain constituted by latches RD39, RD38, ..., RD1, RD0 at the output of the RD0.

With the above configuration, data of latch WD0 is always written into memory block MR (redundant memory block) in write test as shown in FIG. 1. Further, data of memory block MR is always read out to the latch RED in read test as shown in FIG. 2. If both the memory blocks M0 and MR are not defective, the same data is supposed to be always latched to the latches RED and RD0. Further, by incorporating latch RED into the scan chain, it is possible to read out data of latches RD39, RD38, ..., RD1, RD0 together with data of latch RED in the same manner as the ordinary cell test. That is, a cell test combining the ordinary cell test and redundant cell test can be completed in a single write/read operation.

Operation of the semiconductor memory device according to the present embodiment at the test time will be described.

In the same manner as in the conventional ordinary cell test, data of latches WD39, WD38, ..., WD1, WD0 are written into memory blocks M39, M38, ..., M1, M0, MR (write step). Subsequently, data of memory blocks M39, M38, ..., M1, M0, MR are read out to latches RD39, RD38, ..., RD1, RD0, RED (read step). Then, data of latches WD39, WD38, ..., WD1, WD0 and data of latches RD39, RD 38, ..., RD1, RD0 are compared to determine whether ordinary memory blocks (memory blocks M39, M38, ..., M1, M0) are operating normally or not (determination step). That is, when the write data and read data into/from a given memory block coincide with each other, the relevant memory block is determined to be normal. Then, data of latch RED and data of latch RE0 are compared to determine whether the redundant memory block (memory block MR) is operating normally or not.

In the case where memory block M0 is determined to be normal in the ordinary memory block determination step and where the data of latch RED and data of latch RD0 coincide with each other, memory block MR is determined to be normal. In the case where memory block M0 is determined to be normal in the ordinary memory block determination step and where the data of latch RED and data of latch RD0 do not coincide with each other, memory block MR is determined to be abnormal.

Further, in the case where memory block M0 is determined to be abnormal in the ordinary memory block determination step and where the data of latch RED and data of latch RD0 do not coincide with each other, memory block MR is determined to be normal. Further, in the case where memory block M0 is determined to be abnormal in the ordinary memory block determination step and where the data of latch RED and data of latch RD0 coincide with each other, memory block MR is determined to be abnormal.

A configuration is possible in which latch RED is not connected to the scan chain and only the latch RED is output outside through a different output terminal.

Figure 8:
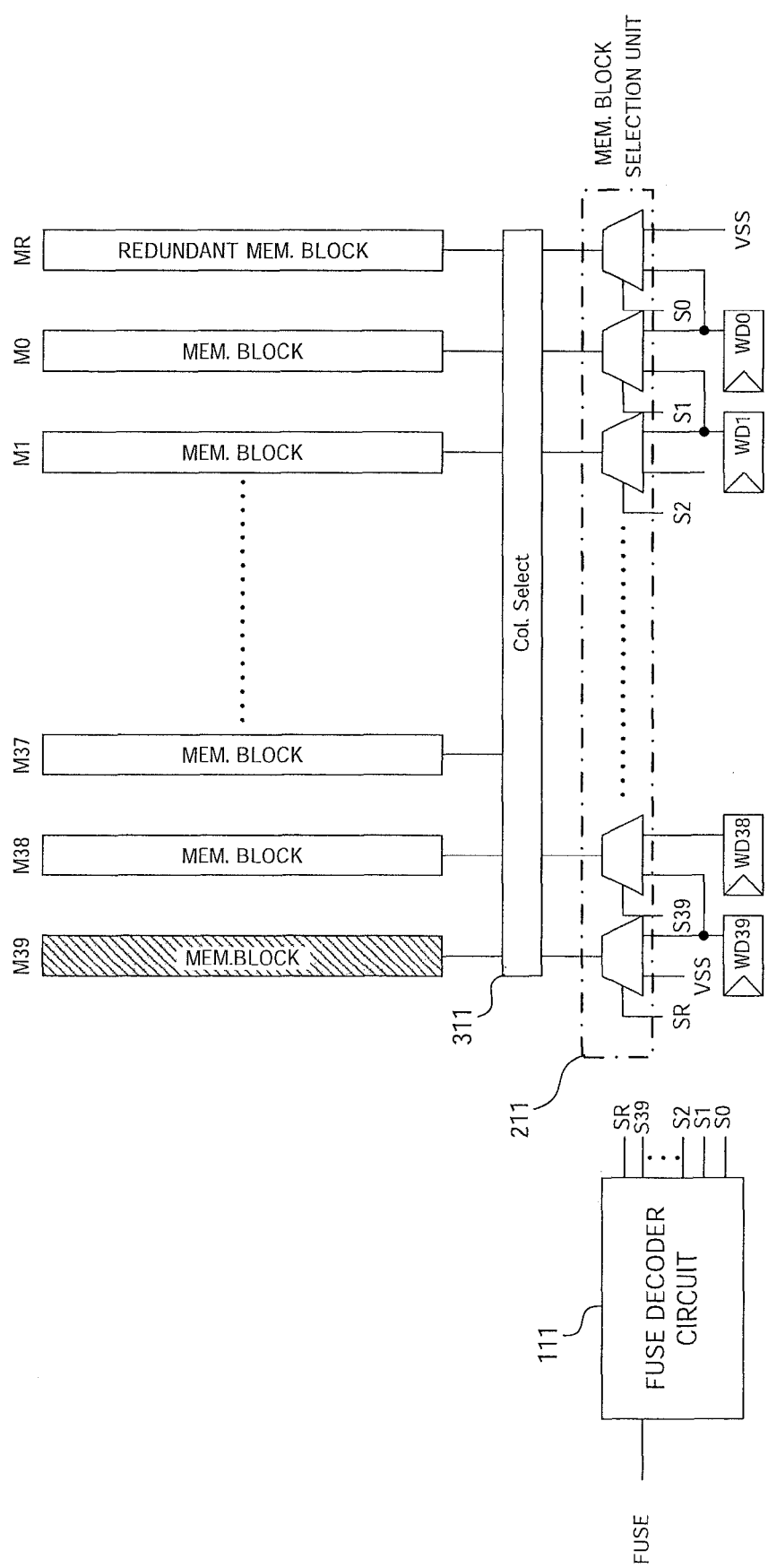
FIG. 8 is a block diagram showing an example of a write structure of a conventional semiconductor memory device.
Figure 9:
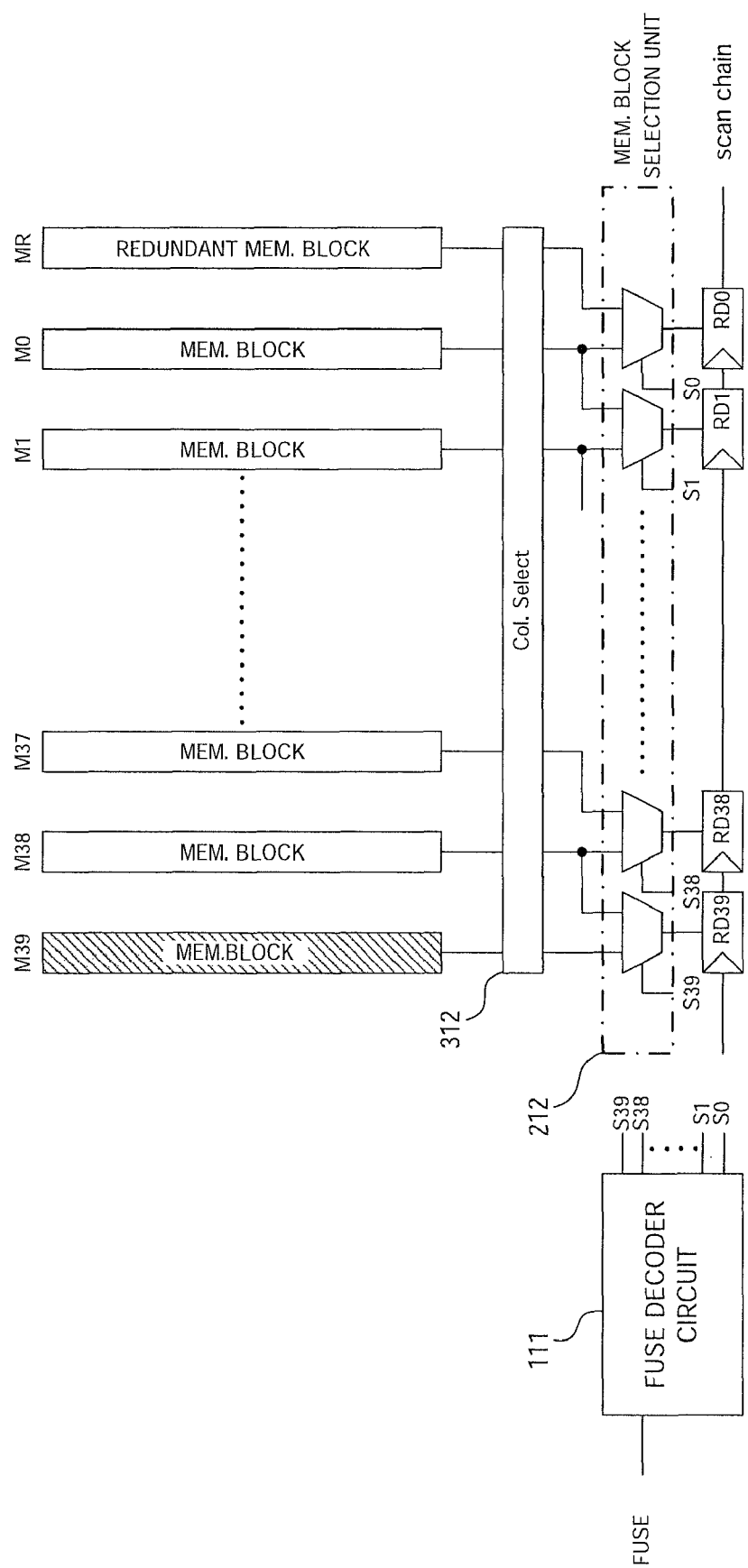
FIG. 9 is a block diagram showing an example of a read structure of a conventional semiconductor memory device.

According to the present embodiment, data can be written into both the ordinary memory blocks and redundant memory block at the same time, data can be read from both the ordinary memory blocks and redundant memory block, whereby an operation test of the ordinary memory blocks and operation test of the redundant memory block can be performed at the same time. This therefore eliminates the need to control the FUSE signal between the ordinary cell test and redundant cell test, which has been desired in the conventional semiconductor memory device. Further, the interface with the outside of the macro is the same as that in the conventional semiconductor device as shown in FIGS. 8 and 9 to which the present invention is not applied. Thus, it is possible to achieve a configuration enabling the ordinary cell test and redundant cell test to be performed at the same time without influencing the designs of its external devices.

Second Embodiment

A configuration of a semiconductor memory device according to the present embodiment will be described below by separating it into a write structure and a read structure.

Figure 3:
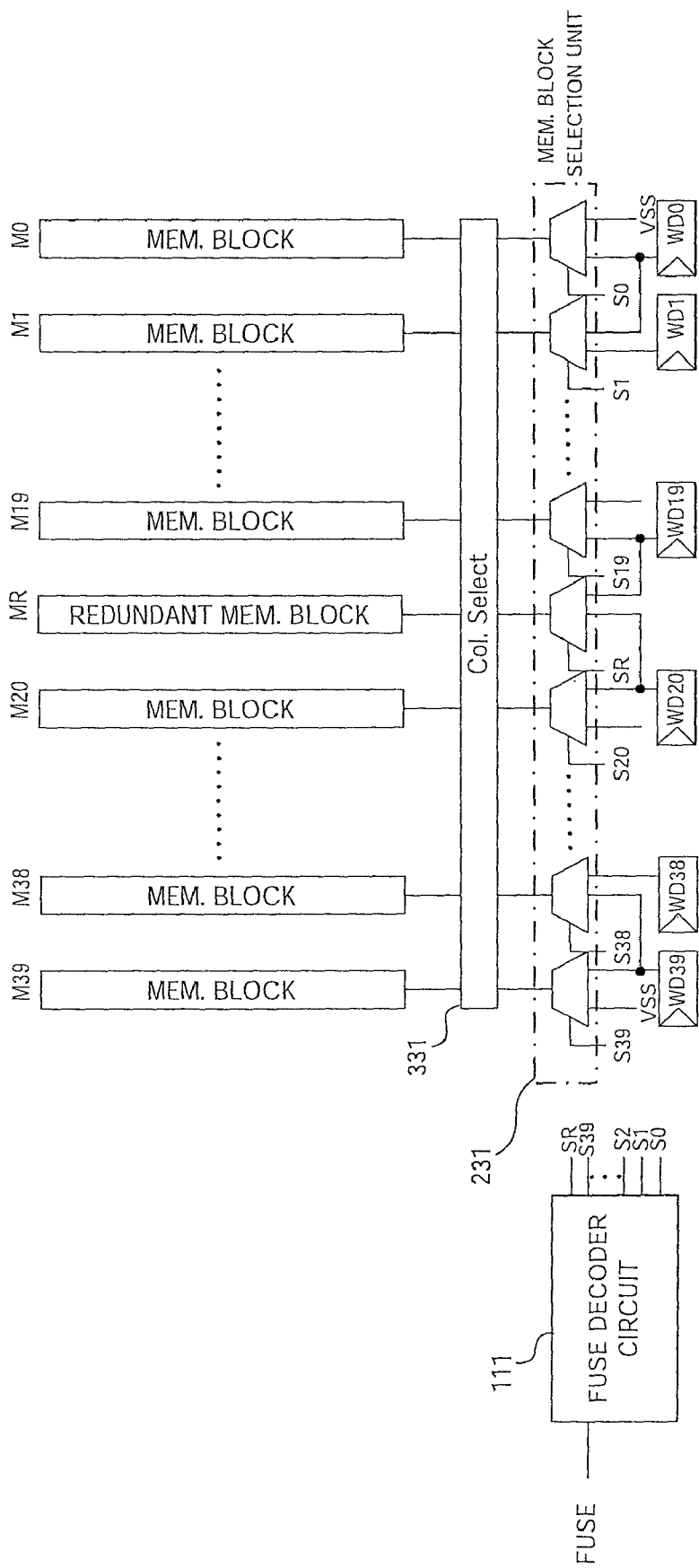
FIG. 3 is a block diagram showing an example of a write structure of a semiconductor memory device according to a second embodiment of the present invention.

FIG. 3 is a block diagram showing an example of a write structure of a semiconductor memory device according to the present invention. In FIG. 3, the same reference numerals as those in FIG. 1 denote the same or corresponding parts as those in FIG. 1, and the descriptions thereof will be omitted here. As shown in FIG. 3, memory block MR is disposed between memory blocks M19 and M20. As compared to the write structure shown in FIG. 1, the semiconductor memory device of FIG. 3 includes a memory block selection unit 231 in place of the memory block selection unit 221 and a column selection circuit 331 in place of the column selection circuit 311.

The memory block selection unit 231 has 41 selectors. The selectors select an input according to corresponding control signals SR, S39, S38, ..., S1, S0 output from the fuse decoder circuit 111 and outputs the selected input to corresponding memory blocks M39, M38, ..., M1, M0, MR.

A selector corresponding to control signal S39 selects VSS (indicating that a corresponding memory block is not used) or data of latch WD39 and writes the selected one into memory block M39. A selector corresponding to control signal S(i) (i is an integer number from 20 to 38) selects data of latch WD(i+1) or data of latch WD(i) and writes the selected one into memory block M(i). A selector corresponding to control signal SR selects data of latch WD20 or data of latch WD19 and writes the selected one into memory block MR. A selector corresponding to control signal S(i) (i is an integer number from 1 to 19) selects data of latch WD (i) or data of latch WD(i−1) and writes the selected one into memory block M(i). A selector corresponding to control signal S0 selects data of latch WD0 or VSS (indicating that a corresponding memory block is not used) and writes the selected one into memory block M0.

Figure 4:
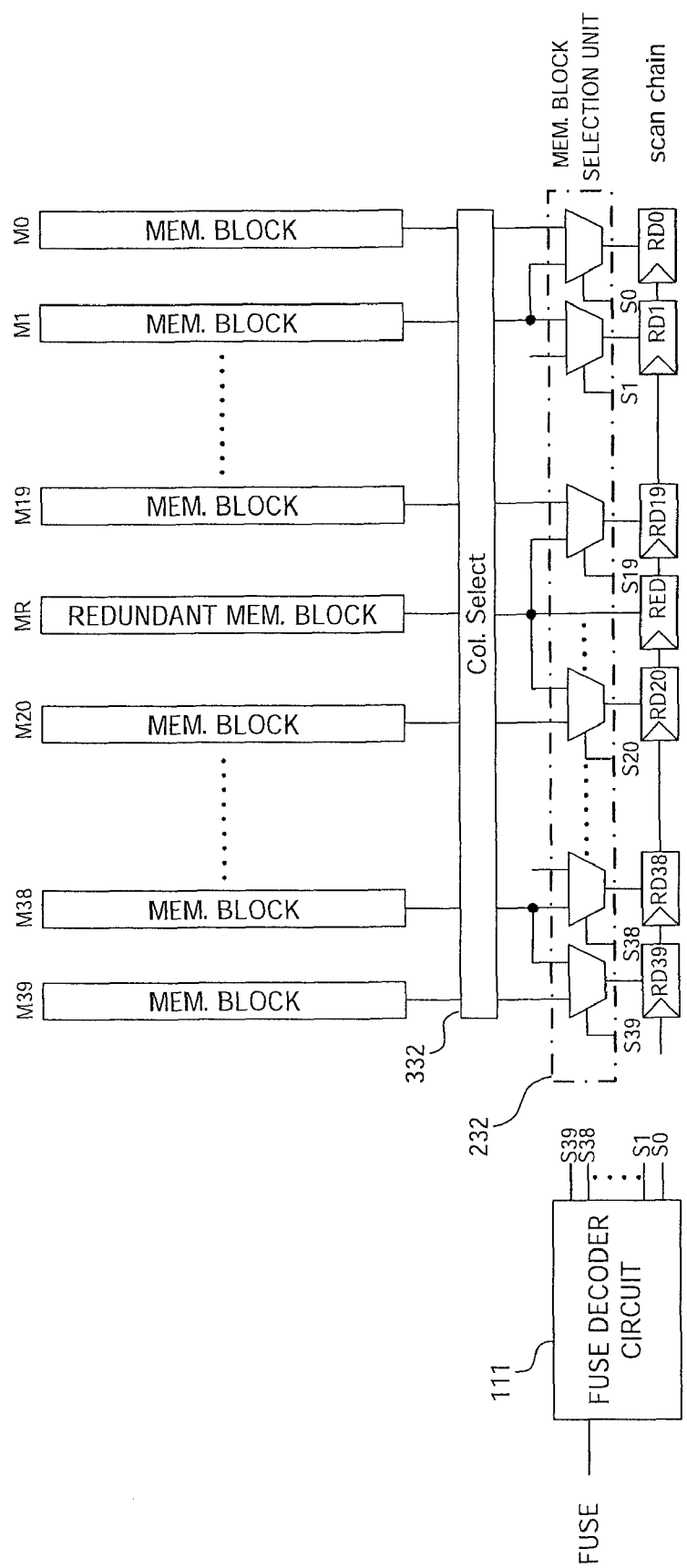
FIG. 4 is a block diagram showing an example of a read structure of the semiconductor memory device according to the second embodiment.

FIG. 4 is a block diagram showing an example of a read structure of a semiconductor memory device according to the present invention. In FIG. 4, the same reference numerals as those in FIG. 2 denote the same or corresponding parts as those in FIG. 2, and the descriptions thereof will be omitted here. As shown in FIG. 4, memory block MR is disposed between memory blocks M19 and M20. As compared to the read structure shown in FIG. 2, the semiconductor memory device of FIG. 4 includes a memory block selection unit 232 in place of the memory block selection unit 212 and a column selection circuit 332 in place of the column selection circuit 312. Latch RED is connected to the scan chain at the position between latches RD20 and RD19.

The memory block selection unit 232 includes 40 selectors. The selectors select an input according to corresponding control signals S39, S38, ..., S1, S0 output from the fuse decoder circuit 111 and outputs the selected input to corresponding latches RD39, RD38, ..., RD1, RD0.

A selector corresponding to control signal S(i) (i is an integer number from 21 to 39) selects data of memory block M (i) or data of memory block M (i−1) and outputs the selected one to latch RD(i). A selector corresponding to control signal S20 selects data of memory block M20 or data of memory block MR and outputs the selected one to latch RD20. A selector corresponding to control signal S19 selects data of memory block MR or data of memory block M19 and outputs the selected one to latch RD19. A selector corresponding to control signal S(i) (i is an integer number from 0 to 18) selects data of memory block M (i+1) or data of memory block M (i) and outputs the selected one to latch RD(i).

With the above configuration, a predetermined one of data of latch WD19 and data of latch WD20 is always written into memory block MR (redundant memory block) in write test as shown in FIG. 3. Further, data of memory block MR is always read out to the latch RED in read test as shown in FIG. 4. Here, a case where data of WD19 is written into memory block MR will be described. In the case where data of latch WD19 and data of latch RD19 coincide with each other after write/read operation, memory block M19 is determined to be normal. In the case where memory block M19 is determined to be normal and where data of latch RED and data of latch RD19 coincide with each other, memory block MR is determined to be normal.

According to the present embodiment, the redundant memory block can be disposed between two ordinary memory blocks, whereby it is possible to perform a test of the redundant memory block by using one of the two ordinary memory blocks.

Third Embodiment

A configuration of a semiconductor memory device according to the present embodiment will be described below by separating it into a write structure and a read structure.

Figure 5:
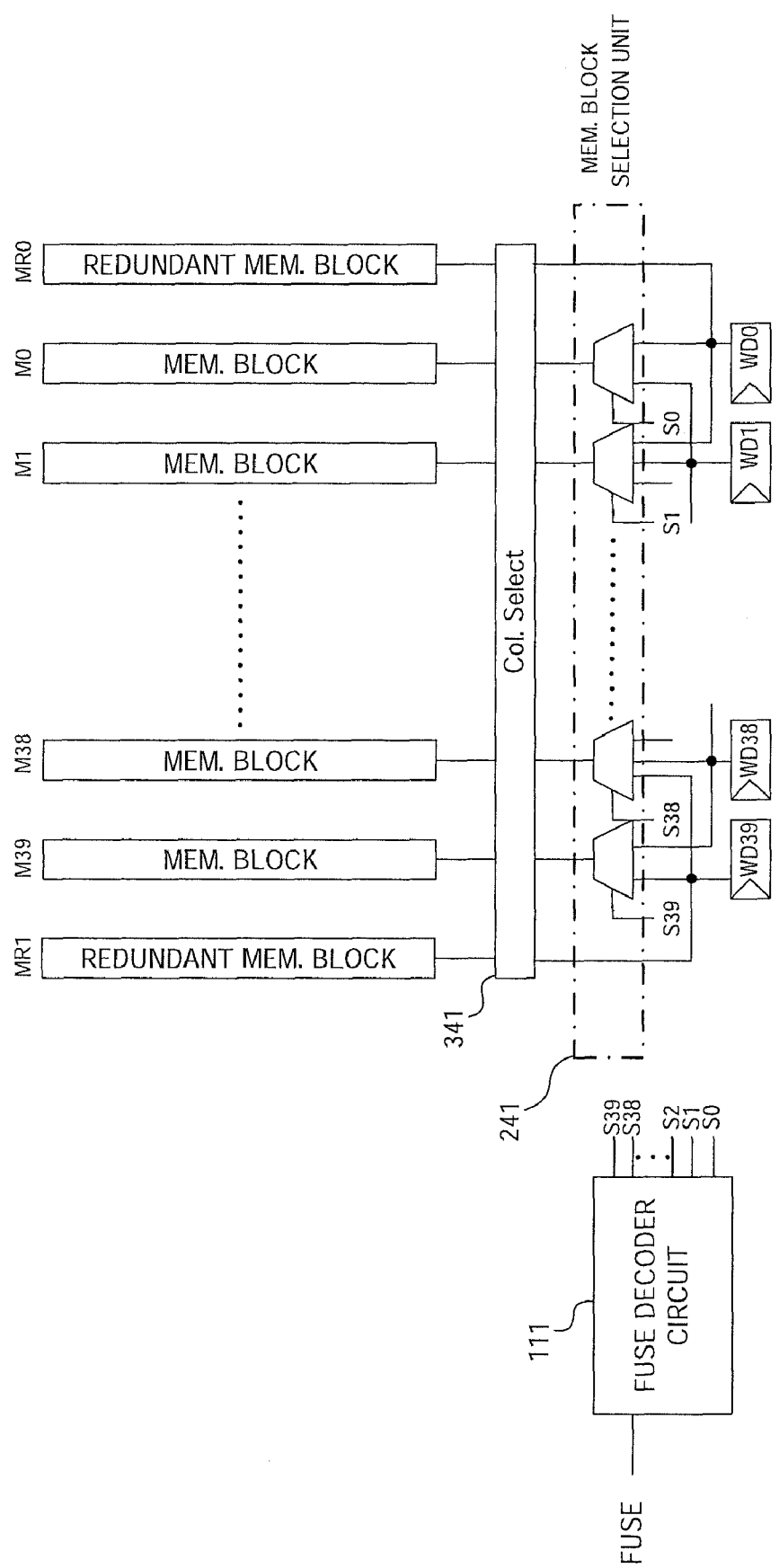
FIG. 5 is a block diagram showing an example of a write structure of a semiconductor memory device according to a third embodiment of the present invention.

FIG. 5 is a block diagram showing an example of a write structure of a semiconductor memory device according to the present invention. In FIG. 5, the same reference numerals as those in FIG. 1 denote the same or corresponding parts as those in FIG. 1, and the descriptions thereof will be omitted here. As shown in FIG. 5, memory block MR1 is disposed outside relative to memory block M39, and memory block MR0 is disposed outside relative to memory block M0. As compared to the write structure shown in FIG. 1, the semiconductor memory device of FIG. 5 includes a memory block selection unit 241 in place of the memory block selection unit 221 and a column selection circuit 341 in place of the column selection circuit 311.

The memory block selection unit 241 has 40 selectors. The selectors select an input according to corresponding control signals S39, S38, . . . , S1, S0 output from the fuse decoder circuit 111 and outputs the selected input to corresponding memory blocks M39, M38, . . . , M1, M0.

A selector corresponding to control signal S39 is a 2-input selector and selects data of latch WD39 or data of latch WD38 and writes the selected one into memory block M39. A selector corresponding to control signal S(i) (i is an integer number from 1 to 38) is a 3-input selector and selects data of latch WD (i+1), data of latch WD(i), or data of latch WD (i−1) and writes the selected one into memory block M(i). A selector corresponding to control signal S0 is a 2-input selector and selects data of latch WD1 or data of latch WD0 and writes the selected one into memory block M0.

Figure 6:
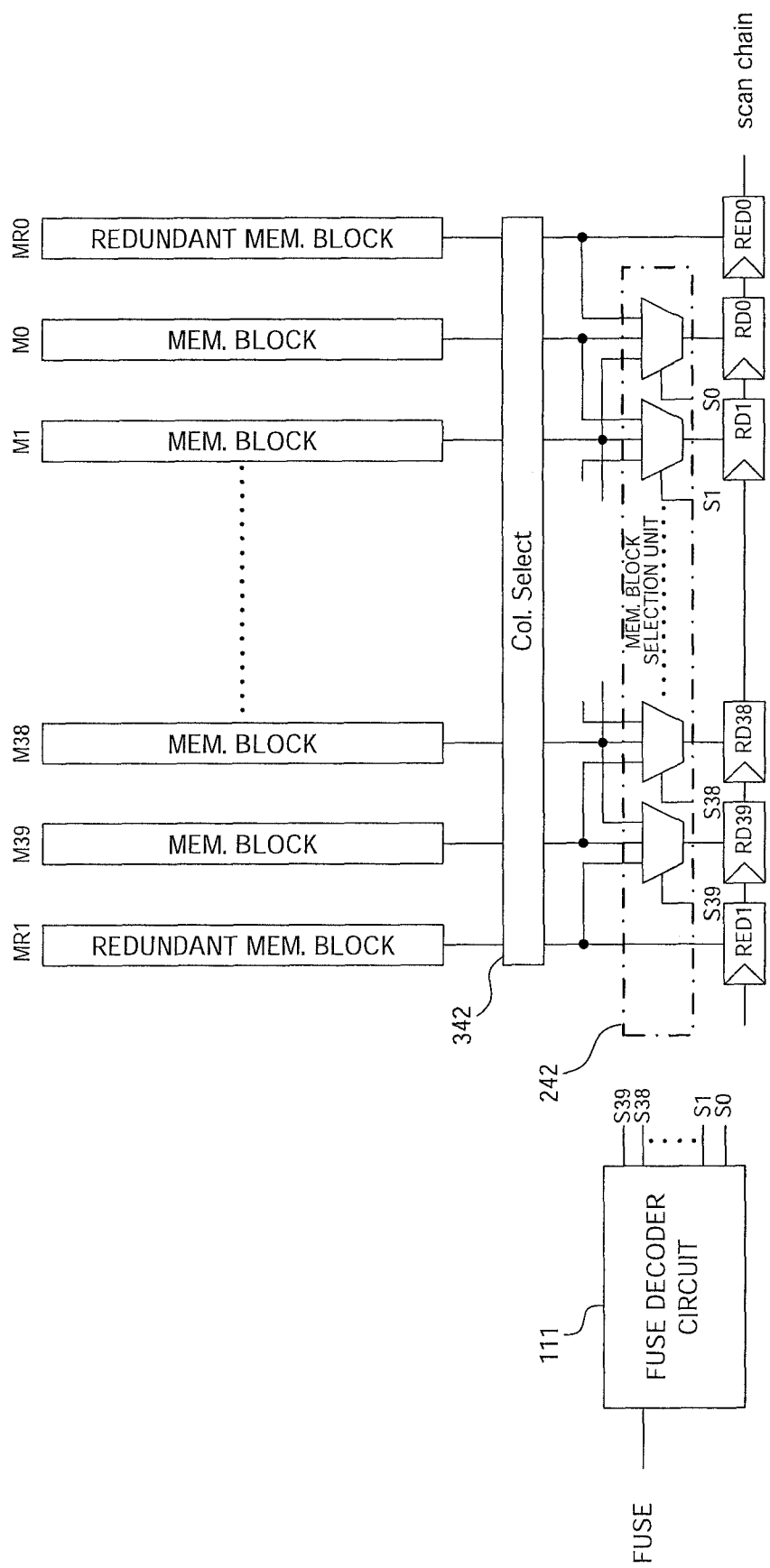
FIG. 6 is a block diagram showing an example of a read structure of the semiconductor memory device according to the third embodiment.

FIG. 6 is a block diagram showing an example of a read structure of a semiconductor memory device according to the present invention. In FIG. 6, the same reference numerals as those in FIG. 2 denote the same or corresponding parts as those in FIG. 2, and the descriptions thereof will be omitted here. As shown in FIG. 6, memory block MR1 is disposed outside relative to memory block M39, and memory block MR0 is disposed outside relative to memory block M0. As compared to the read structure shown in FIG. 2, the semiconductor memory device of FIG. 6 includes a memory block selection unit 242 in place of the memory block selection unit 212, a column selection circuit 342 in place of the column selection circuit 312 and latches RED0 and RED1 in place of latch RED. Latch RED0 is connected to the scan chain at the upstream stage of the latch RD39, and latch RED1 is connected to the scan chain at the downstream stage of the latch RD0.

The memory block selection unit 242 includes 40 selectors. The selectors, which are 3-input selectors, select an input according to corresponding control signals S39, S38, . . . , S1, S0 output from the fuse decoder circuit 111 and outputs the selected input to corresponding latches RD39, RD38, . . . , RD1, RD0.

A selector corresponding to control signal S39 selects data of memory block MR1, data of memory block M39, or data of memory block M38 and outputs the selected one to latch RD39. A selector corresponding to control signal S(i) (i is an integer number from 1 to 38) selects data of memory block M (i+1), data of memory block M (i) or data of memory block M (i−1) and outputs the selected one to latch RD(i). A selector corresponding to control signal S0 selects data of memory block M1, data of memory block M0, or data of memory block MR0 and outputs the selected one to latch RD0.

With the above configuration, data of latch WD39 is always written into memory block MR1 in write test as shown in FIG. 5, and data of latch WD0 is always written into memory block MR0. Further, data of memory block MR1 is always written into latch RED1 in write test as shown in FIG. 6, and data of memory block MR0 is always written into latch RED0.

In the case where data of latch WD39 and data of latch RD39 coincide with each other after write/read operation, memory block M39 is determined to be normal. In the case where memory block M39 is determined to be normal and where data of latch RED1 and data of latch RD39 coincide with each other, memory block MR1 is determined to be normal. Similarly, in the case where data of latch WD0 and data of latch RD0 coincide with each other, memory block M0 is determined to be normal. In the case where memory block M0 is determined to be normal and where data of latch RED0 and data of latch RD0 coincide with each other, memory block MR0 is determined to be normal.

According to the present invention, two redundant memory blocks can be used to thereby cope with a case where defect occurs in two ordinary memory blocks. Further, an operation test of two redundant memory blocks can be performed simultaneously with an operation test of ordinary memory blocks.

Fourth Embodiment

A configuration of a semiconductor memory device according to the present embodiment will be described below by separating it into a write structure and a read structure.

A write structure of the semiconductor memory device according to the present embodiment is the same as that of the first embodiment.

Figure 7:
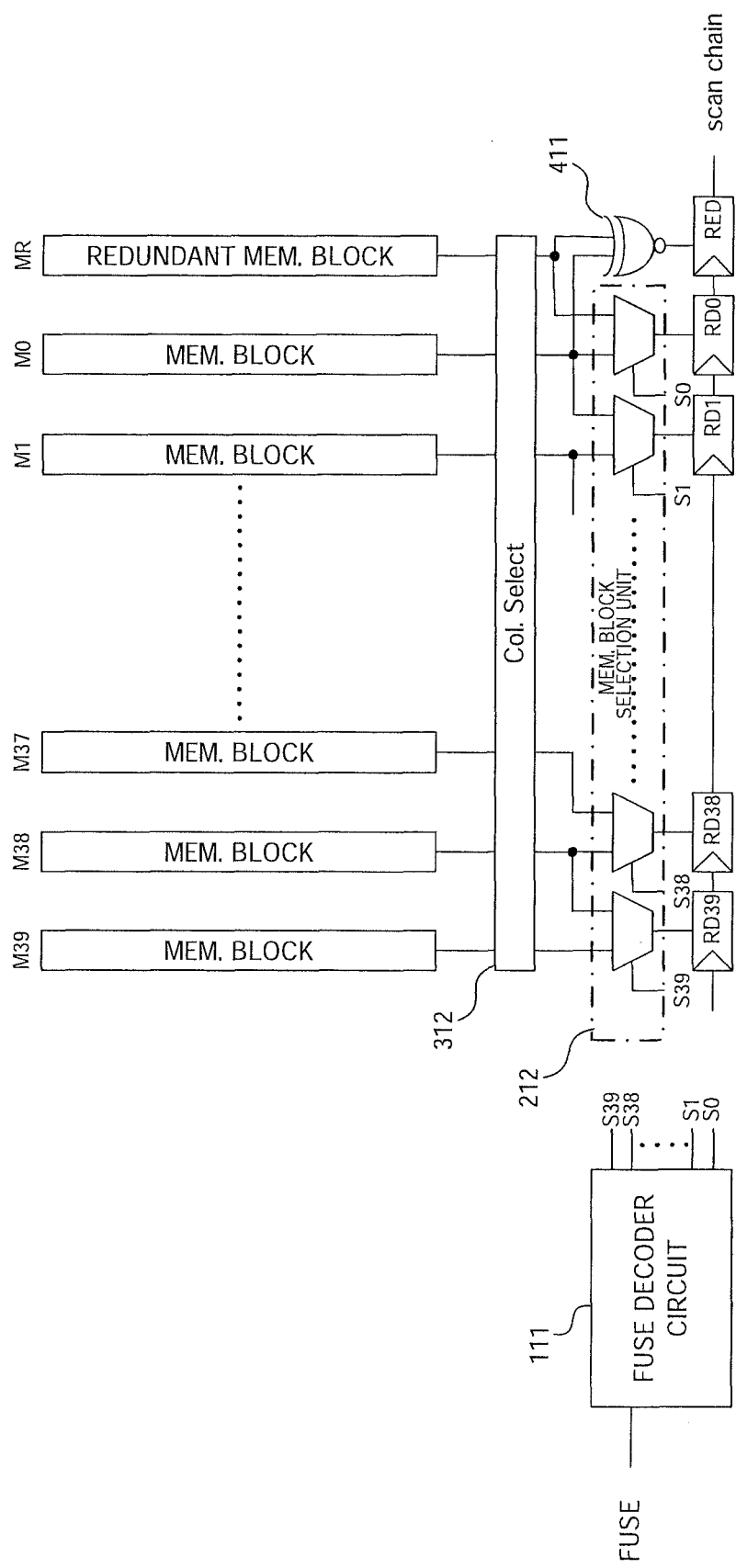
FIG. 7 is a block diagram showing an example of a read structure of a semiconductor memory device according to a fourth embodiment of the present invention.

FIG. 7 is a block diagram showing an example of a read structure of a semiconductor memory device according to the present invention. In FIG. 7, the same reference numerals as those in FIG. 2 denote the same or corresponding parts as those in FIG. 2, and the descriptions thereof will be omitted here. Unlike the read is structure shown in FIG. 2, in the semiconductor memory device of FIG. 7, memory block MR and latch RED are not directly connected to each other but connected through an EXNOR (Exclusive Not OR) unit 411.

The EXNOR unit 411 has two inputs connected to memory blocks M0 and MR and has one output connected to latch RED.

The configuration described above is used to determine whether the ordinary memory blocks are operating normally or not in the same manner as in the first embodiment.

In the case where memory block M0 is determined to be normal in the ordinary memory block determination step and where data of latch RED is 1, memory block MR is determined to be normal. In the case where memory block M0 is determined to be normal in the ordinary memory block determination step and where the data of latch RED is 0, memory block MR is determined to be abnormal.

In the case where memory block M0 is determined to be abnormal in the ordinary memory block determination step and where data of latch RED is 0, memory block MR is determined to be normal. In the case where memory block M0 is determined to be abnormal in the ordinary memory block determination step and where the data of latch RED is 1, memory block MR is determined to be abnormal.

According to the present embodiment, it is possible to obtain, through the scan chain, readout data from ordinary memory blocks, as well as, a comparison result between the readout data from the ordinary memory block and readout data from the redundant memory block, thereby eliminating the need to perform the comparison using an external device.

A first memory block corresponds to the ordinary memory block in the above embodiments. A second memory block corresponds to the redundant memory block in the above embodiments. A selection section corresponds to the selector in the above embodiments. A comparison section corresponds to the EXNOR unit in the above embodiments. A write latch corresponds to each of the latches WD39, WD38, ..., WD1, WD0 in the above embodiments. A read latch corresponds to each of the latches RD39, RD38, ..., RD1, RD0, RED or each of the latches RD39, RD38, ..., RD1, RD0, RED1, RED0 according to the above embodiments.

The semiconductor memory device according to the present embodiments can easily be applied to a semiconductor memory to thereby increase the performance thereof. Examples of the semiconductor memory include an RAM, a flash memory, and the like.

What is claimed is:

1. A semiconductor memory device comprising:
   n first memory blocks, each of the n first memory blocks being used when determined that each of the n first memory blocks is normal;
   a second memory block that is used as an alternative of one of the n first memory blocks when determined that the second memory block is normal and that the one of the n first memory blocks is abnormal;
   n write latches that store n write data respectively;
   n write selectors that write the n write data stored in the n write latches into the n first memory blocks respectively according to an instruction;
   a first circuit that writes one of the n write data stored in one of the n write latches into the second memory block; and
   n read selectors that receive the n write data stored in the n first memory blocks by, receive the one of the n write data stored in the second memory block, and select n data from the received n write data and the received one of the n write data according to the instruction;
   a second circuit that outputs a data based on the one of the n write data stored in the second memory block;
   n first read latches that store the selected n data respectively; and
   a second read latch that stores the outputted data.

2. The semiconductor memory device according to claim 1, characterized in that
   when the n write data stored in the n first memory blocks and the n write data received from the n first memory blocks coincide with each other determining that each of the n first memory blocks is normal, and
   when the n write data stored in the n first memory blocks and the n write data received from the n first memory blocks do not coincide with each other determining that each of the n first memory blocks is abnormal.

3. The semiconductor memory device according to claim 1, characterized in that
   the n first read latches and the second read latch are connected to each other in a scan chain.

4. The semiconductor memory device according to claim 1, characterized by further comprising:
   a comparison section that compares the n write data stored in the n write latches and the selected n data stored in the n first read latches.

5. The semiconductor memory device according to claim 1, characterized in that
   each of the n first memory blocks and the second memory block is constituted by a plurality of memory cells, and one memory cell is selected from the plurality of memory cells according to a selection signal from an external device so as to be subjected to write operation by the n write selectors or read operation by the n read selectors and the second circuit.

6. The semiconductor memory device according to claim 1, wherein the second circuit outputs the one of the n write data stored in the second memory block to the second read latch.

7. The semiconductor memory device according to claim 1, wherein the second circuit carries out an operation on the n write data stored in the n first memory blocks and the one of the n write data stored in the second memory block, and outputs a result of the operation to the second read latch.

8. The semiconductor memory device according to claim 1, wherein the first circuit is a selector that selects two write data stored in two of the n write latches according to the instruction and writes the selected write data to the second memory block.

9. A semiconductor memory device test method that performs a test of a semiconductor memory device comprising:
   storing n write data into n write latches respectively;
   writing, using n write selectors, the n write data stored in the n write latches into the n first memory blocks respectively according to an instruction, each of the n first memory blocks being used when determining that each of the n first memory blocks is normal;
   writing, using a first circuit, one of the n write data stored in one of the n write latches into a second memory block that is used as an alternative of one of the n first memory blocks when determining that the second memory block is normal and that the one of the n first memory blocks is abnormal;
   receiving the n write data stored in the n first memory blocks; and
   receiving the one of the n write data stored in the second memory block;
   selecting n data from the received n write data and the received one of the n write data according to the instruction;
   outputting, using a second circuit, a data based on the one of the n write data stored in the second memory block;
   storing the selected n data in n first read latches respectively; and
   storing the outputted data in a second read latch.

10. The semiconductor memory device test method according to claim 9, further comprising:

determining that each of the n first memory blocks is normal when the n write data stored in the n first memory blocks and the n write data received from the n first memory blocks coincide with each other and that each of the n first memory blocks is abnormal when the n write data stored in the n first memory blocks and the n write data received from the n first memory blocks do not coincide with each other.

11. The semiconductor memory device test method according to claim 9, comprising:

reading data stored in the n first read latches and the second read latch connected in a scan chain.

12. The semiconductor memory device test method according to claim 9, further comprising:

comparing the n write data stored in the n write latches and the selected n data stored in the n first read latches.

13. The semiconductor memory device test method according to claim 9, characterized in that each of the n first memory blocks and the second memory block is constituted by a plurality of memory cells, and one memory cell is selected from the plurality of memory cells according to a selection signal from an external device so as to be subjected to write operation by the n write selectors or read operation by the n read selectors and the second circuit.

\* \* \* \* \*

UNITED STATES PATENT AND TRADEMARK OFFICE
CERTIFICATE OF CORRECTION

| | | |
|---|---|---|
| PATENT NO. | : 8,006,143 B2 | |
| APPLICATION NO. | : 12/393145 | |
| DATED | : August 23, 2011 | |
| INVENTOR(S) | : Fumi Kambara | |

It is certified that error appears in the above-identified patent and that said Letters Patent is hereby corrected as shown below:

Column 9, Line 57, In Claim 1, delete "block; and" and insert --block;--, therefor.

Signed and Sealed this
Twenty-fifth Day of October, 2011

David J. Kappos
*Director of the United States Patent and Trademark Office*